US011454661B2

(12) United States Patent
O'Connor

(10) Patent No.: US 11,454,661 B2
(45) Date of Patent: Sep. 27, 2022

(54) FIELD PROBE

(71) Applicant: Amplifier Research Corp., Souderton, PA (US)

(72) Inventor: Sean R. O'Connor, Fulton, MD (US)

(73) Assignee: Amplifier Research Corp., Souderton, PA (US)

(*) Notice: Subject to any disclaimer, the term of this patent is extended or adjusted under 35 U.S.C. 154(b) by 212 days.

(21) Appl. No.: 17/090,120

(22) Filed: Nov. 5, 2020

(65) Prior Publication Data
US 2022/0137114 A1    May 5, 2022

(51) Int. Cl.
*G01R 29/08* (2006.01)
*H05K 1/14* (2006.01)

(52) U.S. Cl.
CPC ......... *G01R 29/0878* (2013.01); *H05K 1/141* (2013.01); *H05K 1/145* (2013.01)

(58) Field of Classification Search
CPC ...... H05K 1/141; H05K 1/145; H05K 9/0024; H05K 9/0032; H05K 9/0033; G01R 29/0878
See application file for complete search history.

(56) References Cited

U.S. PATENT DOCUMENTS

| 4,150,421 | A | 4/1979 | Nishihara et al. |
| 5,057,848 | A | 10/1991 | Rankin et al. |
| 5,910,524 | A | 6/1999 | Kalinoski |
| 6,564,158 | B1 | 5/2003 | Rabel et al. |
| 6,902,688 | B2 | 6/2005 | Narayan et al. |
| D531,997 | S | 11/2006 | Choder et al. |
| 8,415,943 | B2 | 4/2013 | Dijkstra et al. |
| 2006/0244667 | A1* | 11/2006 | Thompson ........... H01Q 1/3275 343/700 MS |

FOREIGN PATENT DOCUMENTS

| DE | 102012213520 A1 * | 2/2014 | ............. H01Q 1/526 |
| DE | 102016214965 A1 * | 2/2018 | ............... H05K 7/20 |

* cited by examiner

*Primary Examiner* — Paresh Paghadal
(74) *Attorney, Agent, or Firm* — Howson & Howson LLP

(57) ABSTRACT

In an electric field probe for use in calibration of electromagnetic susceptibility testing equipment, processing circuitry for converting electric fields to digitally modulated light transmitted by a fiber optic cable, and circuitry for converting light supplied through a fiber optic cable to current for operating the processing circuitry, are on printed circuit boards that have border portions with conductive edge plating clamped between opposed edges of shells that form a circuit board enclosure. Antenna elements comprising conductive traces on the circuit boards protrude outward from the enclosure through gaps in the plating.

9 Claims, 5 Drawing Sheets

FIELD PROBE

FIELD OF THE INVENTION

This invention relates to radio frequency antennas, and particularly to improvements in a special form of antenna known as a field probe. A field probe is used for measuring the strength of a radio frequency field. Field probes are particularly useful in the calibration of electromagnetic susceptibility testing equipment, in which an electronic device under test is exposed to an electromagnetic field swept through a range of frequencies. The invention relates specifically to improvements in E-field probes.

BACKGROUND OF THE INVENTION

An E-field probe for electromagnetic susceptibility testing generally comprises one or more short antennas mounted on a housing containing processing circuitry. To minimize distortion of the antenna pattern resulting from the presence of conductive cables, the processing circuitry typically includes a transducer which converts a detected r.f. voltage to a digitally modulated light beam, which is then conducted away from the probe through a fiber optic cable. A second fiber optic cable may be used to deliver operating power to the processing circuitry in the form of a laser beam which is converted to D.C. by an optical detector and associated circuitry in the field probe.

An E-field probe is usually a single axis probe or a three axis probe. A typical three axis probe is depicted in U.S. Design Pat. No. D531997, granted on Nov. 14, 2006. The probe comprises a generally spherical enclosure housing the processing circuitry, and three antenna elements protruding outward from the enclosure in mutually perpendicular directions, i.e., along X, Y and Z axes. The spherical enclosure is composed of conductive material, typically a metal such as Aluminum, to shield the internal processing circuitry from the effects of the radio frequency fields to which the probe is exposed. The antenna elements are typically housed in non-conductive, cone-shaped, protective enclosures attached to the exterior of the spherical housing.

Achievement of radio frequency shielding in field probes has been difficult. The internal processing circuitry needs to be protected from the E-field while the antennas need to be exposed to the E-field. The front-end circuitry, i.e., the parts of the processing circuitry connected to the antennas, need a ground reference around the base of each of the antennas. Furthermore, the shielding requires manufacturing consistency. Inconsistencies in the surface current path tend to cause the internal circuitry to be susceptible to direct exposure to the E-field being measured.

SUMMARY OF THE INVENTION

This invention addresses these challenges by sandwiching the edges of the printed circuit boards of the internal processing circuitry between opposed edges of portions of its metal enclosure rather than by using the traditional method of encapsulating the printed circuit boards within the enclosure. In the present invention, a conductive ground area is provided on the edge of the printed circuit board. The ground area consists of conductive areas on both sides of the circuit board adjacent the edge of the board, and a conductive area on the edge of the board, connecting the two conductive areas on the opposite sides of the board together. Conductive gaskets, each preferably composed a nickel-graphite impregnated silicone gasket material, are provided between the edges of the enclosure parts and the conductive areas adjacent the edges of the circuit board. This creates a continuous path for current along the surface of the enclosure. The gasket is flexible, and conforms to imperfections in the enclosure and the surface of the printed circuit.

Briefly, in a preferred embodiment, the field probe comprises a spherical enclosure composed of one hemispherical shell and two additional shells, each of the additional shells being in the form of one half of a hemisphere. A first printed circuit board is circular in shape, and is clamped on one side by a circular edge of the hemispherical shell and, on its opposite side by one semicircular edge of each of the other two shells. The first circuit board has two protruding portions extending outward from the enclosure in mutually perpendicular directions. The protruding portions serve as two of three antennae of the field probe. A second circuit board, which is in the shape of a semicircular segment, is disposed in perpendicular relationship to the first circuit board and has its semicircular edge clamped between the other semicircular edges of the two half-hemispherical shells. A protruding portion of the second circuit board extends in perpendicular relation to the directions of the two protruding portions of the first circuit board and serves as a third antenna of the field probe.

The field probe in accordance with the invention comprises at least one antenna element, at least one circuit board carrying processing circuitry for processing electric current from the antenna element resulting from an electric field to which the antenna element is exposed, and producing an output, and an enclosure containing a major part of the circuit board. The output of the processing circuitry is preferably a digitally modulated light beam transmitted by a fiber optic cable.

The circuit board is provided with electrically conductive edge plating comprising first and second conductive layers on opposite sides of the circuit board along an edge thereof and a third conductive layer extending over said edge of the circuit board and electrically connecting the first and second conductive layers.

The enclosure comprises at least two electrically conductive shells. A first of these shells has an edge in opposed relationship to the first conductive layer, a second shell has an edge in opposed relationship to the second conductive layer. The enclosure also includes a first electrically conductive gasket compressed between the edge of the first shell and the first conductive layer, and a second electrically conductive gasket compressed between the edge of the second shell and the second conductive layer.

The circuit board includes a protruding portion extending outward from the enclosure through a space between the edge of the first shell and said edge of the second shell. This protruding portion extends through a gap in the third conductive layer. The antenna element is supported by the protruding portion of the circuit board and preferably comprises an electrically conductive trace. Preferably, the circuit board is a multi-layer circuit board, and the electrically conductive trace is located on an internal layer of the circuit board.

In the preferred embodiment, in which the probe has three mutually perpendicular antenna elements, three electrically conductive shells cooperatively form the enclosure. A first of these shells is hemispherical and has a circular edge disposed in a plane. Each of the second and third shells is in the form of one half of a hemisphere, and has two semi-circular shell edges disposed in mutually perpendicular planes, each of the shell edges of the second and third shells is in opposed relationship to a shell edge of another one of the shells.

The three antenna elements extend outward from the enclosure, and each antenna element extends in a direction perpendicular to the directions in which the other two antenna elements extend.

This embodiment includes first and second printed circuit boards. Each of the first and second circuit boards comprises a part within the enclosure that includes circuitry for processing electric current from the antenna elements resulting from an electric field to which the antenna elements are exposed, and producing an output representative of the field.

Each of these two printed circuit boards has first and second opposite faces and a circuit board edge, a first conductive layer on the first face and extending along a border portion of the circuit board, a second conductive layer on the second face and extending along the border portion of the circuit board, and a third conductive layer on the circuit board edge and electrically connecting the first and second conductive layers;

A first part of the border portion of the first printed circuit board is clamped between a first semi-circular shell edge of the second shell and a part of the circular shell edge of the first shell, and a second part of he border portion of the first printed circuit board is clamped between a first semi-circular shell edge of the third shell and another part of the circular shell edge of the first shell. A part of the border portion of the second printed circuit board is similarly clamped between a second semi-circular shell edge of the second shell and a second semi-circular shell edge of the third shell.

A length of electrically conductive, compressible, gasket material extends along the length of each of the shell edges, and is compressed between the last-mentioned shell edge and an adjacent border portion of one of the printed circuit boards in opposed relationship to the last-mentioned shell edge.

A first of the three antenna elements is supported by a portion of the first circuit board extending outward from the enclosure and through a first gap in the third conductive layer on the edge of the first circuit board.

A second one of the antenna elements is supported by a portion of the first circuit board extending outward from the enclosure and through a second gap in the third conductive layer on the edge of the first circuit board.

A third one of the antenna elements is supported by a portion of the second circuit board extending outward from the enclosure and through a second gap in the third conductive layer on the edge of the second circuit board.

The antenna elements are preferably constituted by electrically conductive traces, which can be on the exteriors of the circuit boards. Again, however, each of the circuit boards is preferably a multi-layer circuit board, and the electrically conductive traces that serve as the antenna elements are located on internal layers of the circuit boards.

DETAILED DESCRIPTION OF THE PREFERRED EMBODIMENTS

Figure 1:
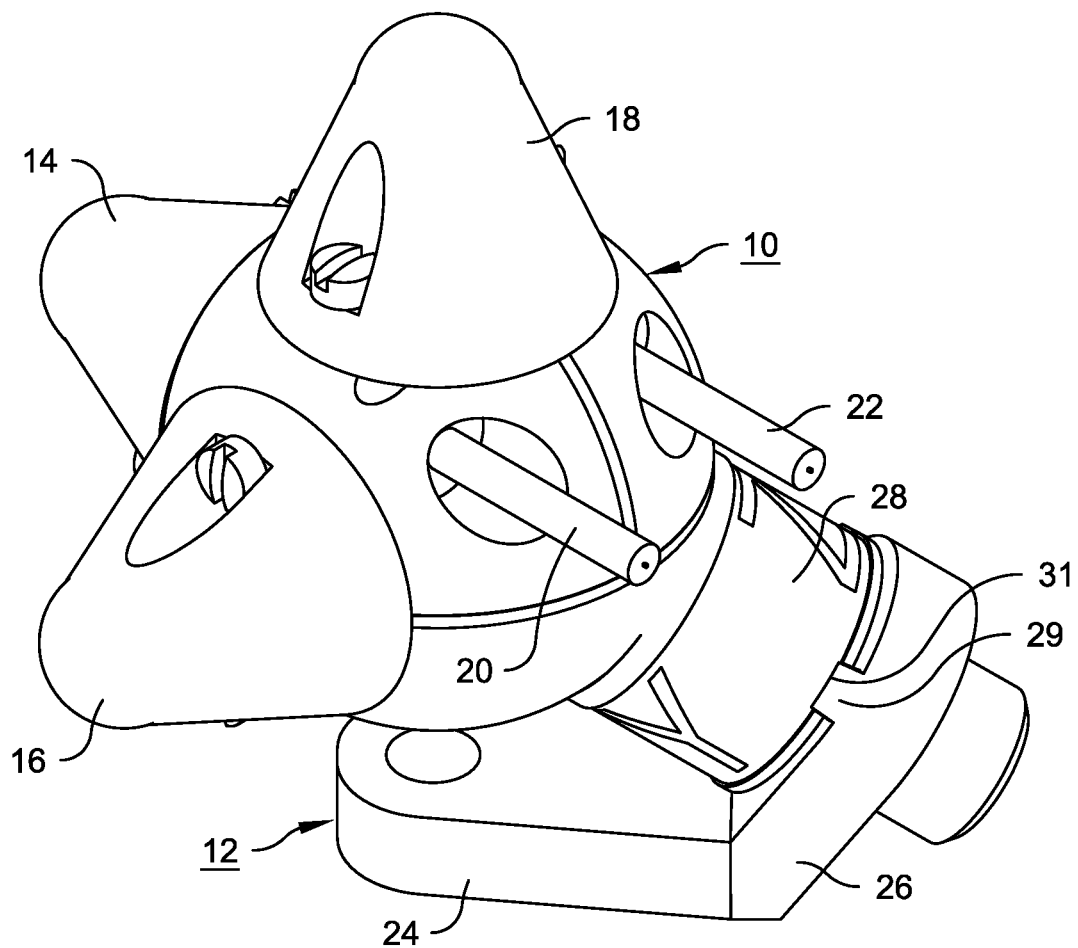
FIG. 1 is a perspective exterior view of a field probe in accordance with the invention.

As shown in perspective view in FIG. 1, the preferred field probe in accordance with the invention, comprises a spherical, electrically conductive enclosure 10, supported on a supporting base 12. Three non-conductive conical antenna covers 14, 16 and 18 extend outward from the spherical enclosure in mutually perpendicular relationship to one another, and two fiber optic cables 20 and 22 extend through sealed openings from the exterior into the interior of the enclosure. One of the cables carries laser energy to supply operating power to processing circuitry within the enclosure, and the other delivers the output of the processing circuitry in the form of a digitally modulated light beam.

The processing circuitry can be similar to processing circuitry commonly utilized in field probes. Typically, an antenna is connected to a diode detector with amplification, or an antenna is connected to a log detector integrated circuit chip. The detector output is fed to additional amplification stages and/or buffer stages. The output of the amplification and/or buffer stages is connected to an analog-to-digital converter to digitize the detected signal. The digital samples are then processed in a microcontroller. The processing includes correction of any non-linearity caused by the detection circuits and then related to an electric field amplitude value in volts-per-meter (V/m). The resulting V/m values are transmitted digitally over fiber to a computer. Electrical power for operating the processing circuitry is provided by a photonic or optical power converter, that converts laser light delivered through a fiber optic cable to electrical power. The resulting output is regulated and supplied to the processing circuit components.

Examples of field probes that include processing circuitry for delivering field data through optical fibers are found in U.S. Pat. No. 5,057,848, granted on Oct. 15, 1991, U.S. Pat. No. 6,564,158, granted on May 13, 2003 and U.S. Pat. No. 8,415,943, granted on Apr. 9, 2013. The field probe in U.S. Pat. No. 8,415,943 also utilizes an optical power converter. The disclosures of these three patents are here incorporated by reference.

The base 12 includes a first part 24 for attachment to a horizontal supporting surface and a second part 26, extending obliquely upward from the first part at an angle of 54.7°. The enclosure is connected to the second part 26 by a rotatable arm 28, which extends along an axis disposed at an angle of 35.3° relative to the horizontal. The antenna covers are arranged symmetrically relative to the axis of arm 28, each having its axis at an angle of 54.7° relative to the axis of arm 28. The arm is normally locked against rotation, but can be rotated to reposition the antenna elements, and allows the enclosure to be rotated to positions such that any one of the three mutually perpendicular antenna covers can be vertical while the other two are horizontal. A locking tab 29 mates releasably with a recess 31 on arm 28 to maintain two of the three antennae horizontal while the third antenna is vertical. Additional locking tabs (not shown) are provided in order to maintain two of the three antennae horizontal, and a third antenna vertical, when the enclosure is rotated to each two other orientations.

Figure 2:
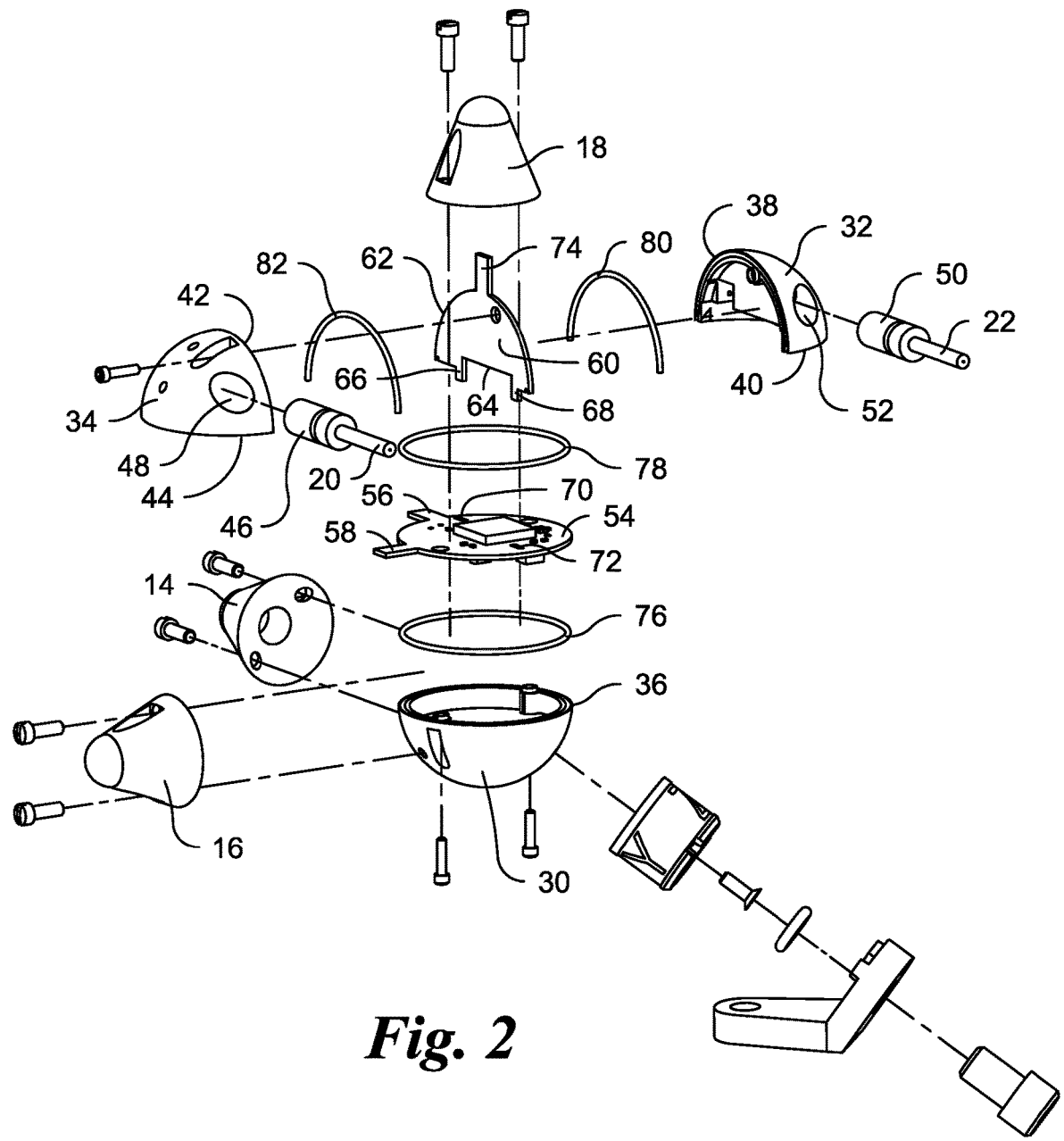
FIG. 2 is an exploded view of the field probe of FIG. 1.

The exploded view, FIG. 2, shows the enclosure as composed of three shells: a hemispherical shell 30, and two shells 32 and 34, each of which is in the shape of one-half of a hemisphere. Shell 30 has a circular edge 36, shell 32 has two semi-circular edges 38 and 40 lying respectively in perpendicular planes, and shell 34 similarly has two semi-circular edges 42 and 44 lying respectively in perpendicular planes.

Fiber optic cable 20 extends into the enclosure through a conductive fitting 46 which fits into an opening 48 in shell 34. Similarly, fiber optic cable 22 extends into the enclosure through a conductive fitting 50, which fits into an opening 52 in shell 32.

The enclosure, composed of shells 30, 32 and 34 houses two printed circuit boards which carry processing circuitry for converting the outputs of the antenna elements into digitally modulated light which is delivered through one of cables 20 and 22 and circuitry for converting the energy of the laser-generated light beam received through the other fiber optic cable into direct current for operating the processing circuitry.

A first printed circuit board 54 is circular in shape, but has two protrusions, 56 and 58, which include conductive traces that serve as two of the three antenna elements. These protrusions extend respectively into antenna covers 14 and 16. The radius of the circular perimeter of circuit board 54 is the same as the radius of the outer part of the circular edge 36 of shell 30.

The second printed circuit board 60 has a semicircular edge 62, and an edge 64 formed with two tabs 66 and 68, which fit into slots 70 and 72 respectively in circuit board 54 when the two circuit boards are in perpendicular relationship. Circuit board 60 is formed with a protrusion 74, which includes a conductive trace that serves as a third antenna element and extends into antenna cover 18. The radius of the semicircular edge 62 of circuit board 60 is equal to the radii of the outer parts of edges 38 and 42 of shells 32 and 34.

A first part of the border portion of circuit board 54, i.e., a narrow area extending radially inward from the perimeter, is clamped between semi-circular edge 40 of shell 32 a part of the circular edge 36 of shell 30. A second part of the border portion of circuit board 54 is clamped between semi-circular edge 44 of shell 34 and another part of the circular edge 36 of shell 30. A first, ring-shaped, length 76 of electrically conductive gasket material is compressed between the circular edge 36 of shell 30 and the bottom face of the border portion of circuit board 54. A second, ring-shaped length 78 of electrically conductive gasket material is engaged with the upper face of the border portion of circuit board 54 and a part of this second length of gasket material is compressed between edge 40 of shell 32 and a part of the border portion of circuit board 54 and another part is compressed between edge 44 of shell 34 and another part of the border portion of circuit board 54. Protrusions 56 and 58 extend outward beyond the gasket material.

An example of a preferred gasket material is a silicone elastomer incorporating conductive particles of nickel-coated graphite. Suitable gasket materials are produced by Schlegel Corporation, located at 1600 Lexington Avenue, Rochester, N.Y. 14606. Silicone elastomer gasket materials incorporating nickel coated graphite particles are described in U.S. Pat. No. 5,910,524, granted on Jun. 8, 1999 and U.S. Pat. No. 6,902,688, granted on Jun. 7, 2005, the disclosures of which are incorporated by reference.

The border portion of circuit board 60 adjacent the semicircular edge 62 of the circuit board is clamped between the semicircular edge 38 of shell 32 and semicircular edge 42 of shell 34. A first semi-circular length 80 of electrically conductive gasket material is compressed between one face of the border portion of circuit board 60 and edge 38 of shell 32. A second semi-circular length 82 of electrically conductive gasket material is compressed between the opposite face of the border portion of circuit board 60 and edge 42 of shell 34. The shells are secured together by screw fasteners shown in the exploded view. The screw fasteners secure the shells together to form the spherical enclosure, and maintain the clamping action of the shells on the circuit boards and compression of the gasket material. The exploded view also shows screw fasteners that secure the conical antenna covers to the spherical enclosure.

Figure 3:
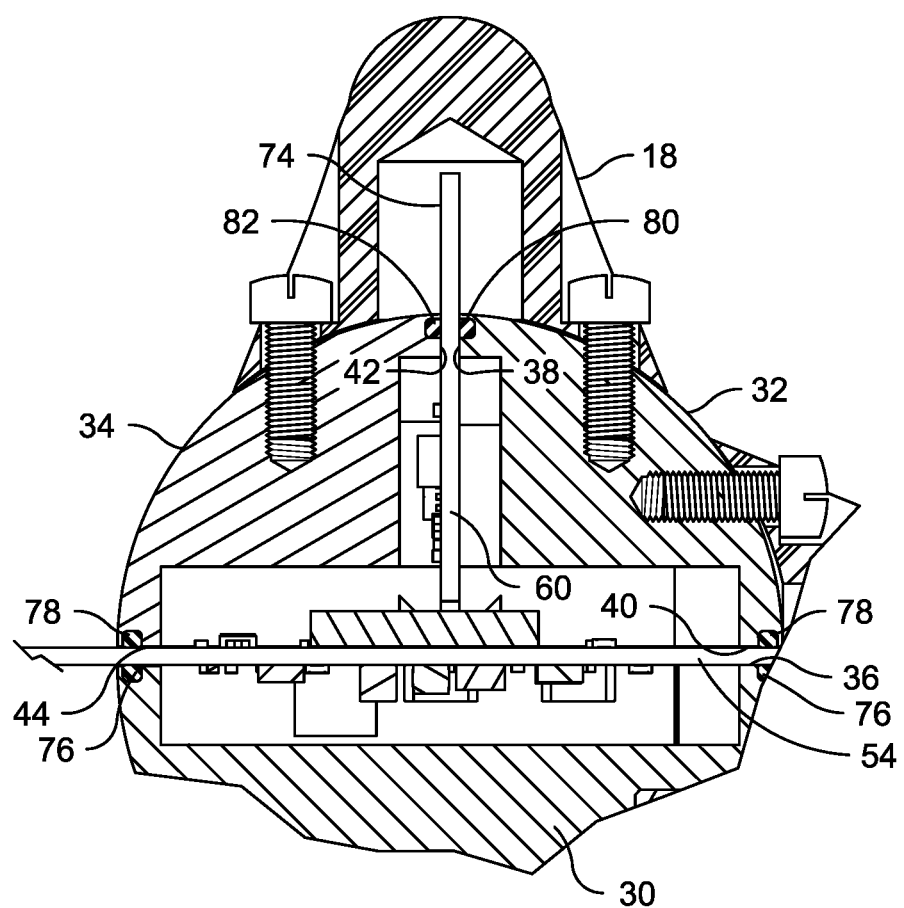
FIG. 3 is a partial cross-sectional view showing a part of a circuit board extending outward from the enclosure into one of the conical antenna covers.

FIG. 3 shows, in cross-section, the clamping of a part of the border portion of circuit board 54 between edge 36 of shell 30 and edge 40 of shell 32. It also shows the clamping of another part of the border portion of circuit board 54 between edge 36 of shell 30 and edge 44 of shell 34.

Figure 4:
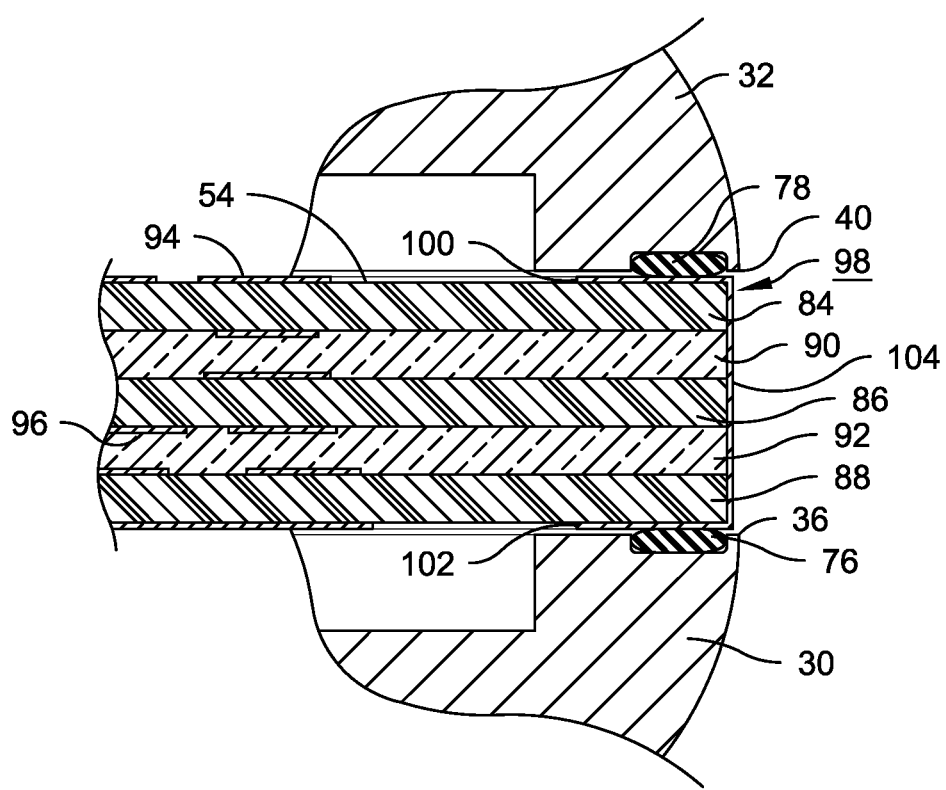
FIG. 4 is a cross-sectional view showing details of a circuit board edge sandwiched between opposed edges of two shells of the conductive enclosure.

As shown in FIG. 4, printed circuit board 54 is a multi-layer circuit board composed of three layers, 84, 86 and 88, of resin, typically an epoxy resin, separated from one another by layers 90 and 92 of glass fiber prepreg. Copper traces on the resin layers, e.g., traces 94 and 96, provide connections between circuit components (not shown) mounted on the multi-layer board. Openings (not shown) in the layers allow for electrical connection of components mounted on the exterior of the multi-layer board to internal copper traces. A typical multi-layer circuit board is described in U.S. Pat. No. 4,150,421, granted on Apr. 17, 1979, and the disclosure of U.S. Pat. No. 4,150,421 is here incorporated by reference.

The border portion of the multi-layer circuit board, i.e., a portion of the board that is clamped between edges of the shells, is plated with a conductive edge plating 98, which is continuous and includes a first conductive layer 100 on one face of the circuit board, a second conductive layer 102 on the opposite face of the circuit board, and a third conductive layer 104 on the edge of the circuit board, which connects layers 100 and 102. The conductive length 76 of gasket material is shown compressed between edge 36 of shell 30 and layer 102 of the edge plating. Similarly, the length 78 of conductive gasket material is compressed between edge 40 of shell 32 and layer 100 of the edge plating. Recesses are provided in the edges of the shells to maintain the position of the gasket material.

The layers 100 and 102 of the edge plating on the upper and lower faces of the circuit board are continuous along the border portion that is clamped between shells. The layer 104, that extends from layer 100 to layer 102 is likewise continuous except at the locations of the antenna elements, where a gap is provided in layer 104 through which protrusions 56 and 58 extend.

Figure 5:
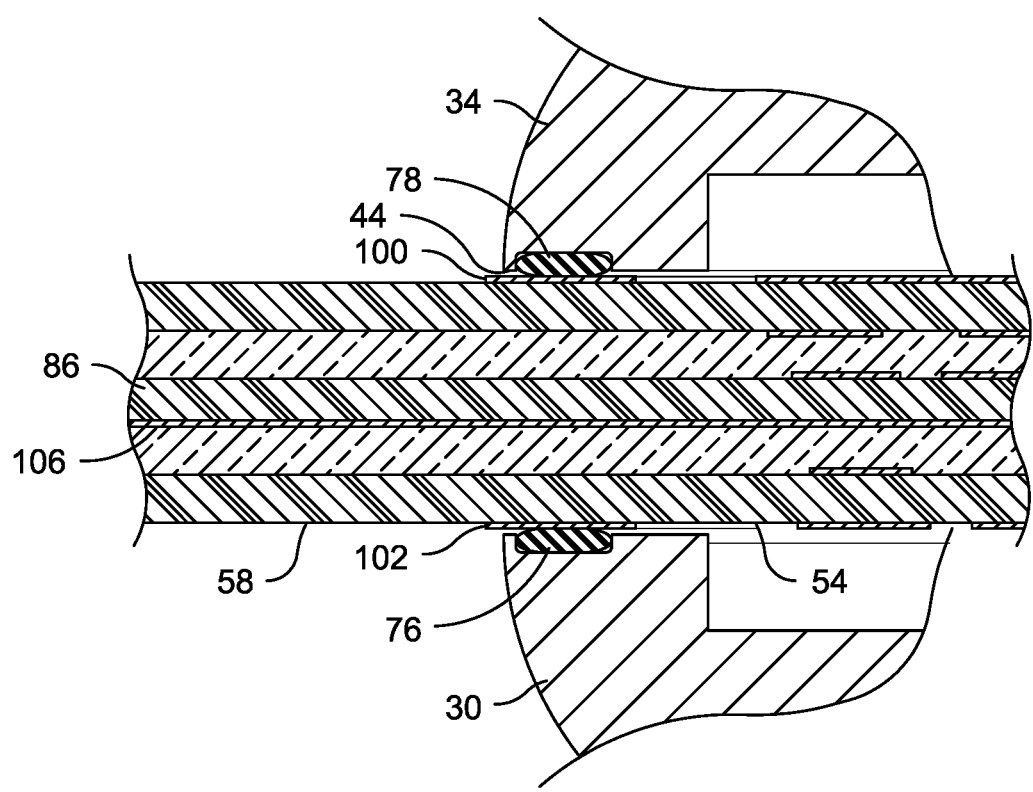
FIG. 5 is a cross-sectional view showing details of a part of a circuit board extending outward through a space between opposed edges of two shells of the enclosure and including a conductive trace forming an antenna element.

As shown in FIG. 5, protrusion 58 of circuit board 54 extends through a gap between edge plating layers 100 and 102 where layer 104 is not present. The antenna element in protrusion 54 is constituted by a conductive trace 106 on the underside of circuit board layer 86.

The use of edge plating on the circuit board or circuit boards of a field probe, and the clamping of the circuit board face layers of the edge plating between opposed edges of conductive shells that compose the circuit board enclosure, using compressible conductive gaskets produces an important advantage. It avoids abnormalities in current paths on the surface of the enclosure that can produce magnetic fields that can interfere with the proper operation of the processing circuitry that converts the antenna outputs into a digitally modulated optical beam for transmission through an optical fiber cable.

The performance of the field probe is enhanced by the provision of a ground reference closely surrounding the base of each of the antenna elements, by utilizing an internal conductive layer in a protruding portion of a multi-layer circuit board which extends through a gap in the board edge portion of the edge plating.

Advantages of the invention can be realized in field probes having single antenna elements or three antenna elements, and also in field probes having other numbers and arrangements of antenna elements.

Various modifications can be made to the field probe described above. For example, whereas in the embodiment described, the antenna elements are constituted by conductive traces on an internal layer of a circuit board, in alternative embodiments, the antenna elements can be situated on the exterior of the circuit boards. Morever, the antenna elements can be composed of resistive alloys such as NiCr (Nickel-Chromium), NCAS (Nickel Chromium Aluminum Silicon), or CrSiO (Chromium Silicon Monxide). The antenna elements can also be composed of multiple discrete components, for example resistor networks, as in U.S. Pat. No. 6,593,896 granted on Jul. 15, 2003. The compressible gaskets, which are preferably a nickel-graphite silicone material, can be composed of other materials such as solder preforms, i.e., solders of various compositions, stamped into a predefined shape.

Other modifications, such as modifications in the shape of the enclosure, can be made without departing from the scope of the invention as defined in the following claims.

What is claimed is:

1. A field probe comprising an antenna element, a circuit board carrying processing circuitry for processing electric current from the antenna element resulting from an electric field to which said antenna element is exposed, and producing an output representative of said field, and an enclosure containing a major part of said circuit board, wherein said circuit board is provided with electrically conductive edge plating comprising first and second conductive layers on opposite sides of the circuit board along an edge thereof and a third conductive layer extending over said edge of the circuit board and electrically connecting said first and second conductive layers;

wherein said enclosure comprises at least two electrically conductive shells, a first of said shells having an edge in opposed relationship to said first conductive layer, a second of said shells having a an edge in opposed relationship to said second conductive layer, a first electrically conductive gasket compressed between said edge of the first of said shells and said first conductive layer, and a second electrically conductive gasket compressed between said edge of the second of said shells and said second conductive layer;

wherein said circuit board includes a protruding portion extending outward from said enclosure through a space between said edge of the first of said shells and said edge of the second of said shells and through a gap in said third conductive layer; and wherein said antenna element is supported by said protruding portion of said circuit board.

2. The field probe according to claim 1, in which said antenna element is an electrically conductive trace supported by said protruding portion of said circuit board.

3. The field probe according to claim 2, in which said circuit board is a multi-layer circuit board, and in which said electrically conductive trace is located on an internal layer of said circuit board.

4. A field probe comprising:
at least two electrically conductive shells cooperatively forming a hollow enclosure, each of said shells having at least one shell edge disposed substantially in a plane, and each said shell edge being in opposed relationship to a shell edge, also disposed substantially in a plane, of another one of said shells;

at least one antenna element extending outward from said enclosure;

at least one printed circuit board mounted within said enclosure and including means for processing electric current from the antenna element resulting from an electric field to which said antenna element is exposed, and producing an output representative of said field;

wherein said printed circuit board has first and second opposite faces and a circuit board edge, a first conductive layer on the first face and extending along a border portion of the circuit board, a second conductive layer on the second face and extending along said border portion of the circuit board, and a third conductive layer on said circuit board edge and electrically connecting said first and second conductive layers;

wherein said field probe also comprises first and second, electrically conductive, compressible, gaskets;

wherein said border portion of the circuit board is clamped between a first one of said shell edges on one of said shells and a second one of said shell edges on another one of said shells in opposed relationship to said first one of said shell edges;

wherein said first electrically conductive compressible gasket is disposed and compressed between said first one of said shell edges and said first conductive layer, and said second compressible conductive gasket is disposed and compressed between said second of said shell edges and said second conductive layer; and wherein a portion of said circuit board extends outward from said enclosure through a space between said first and second shell edges and through a gap in said third conductive layer, and said antenna element is supported by said portion of said circuit board.

5. The field probe according to claim 4, in which said antenna element is an electrically conductive trace supported by said protruding portion of said circuit board.

6. The field probe according to claim 5, in which said circuit board is a multi-layer circuit board, and in which said electrically conductive trace is located on an internal layer of said circuit board.

7. A field probe comprising:
three electrically conductive shells cooperatively forming a hollow enclosure, a first of said shells being hemispherical and having a circular edge disposed in a plane, and each of the second and third of said shells being in the form of one half of a hemisphere and having two semi-circular shell edges disposed in mutually perpendicular planes, each said semi-circular shell edge being in opposed relationship to a shell edge of another one of said shells;

three antenna elements extending outward from said enclosure, each antenna element extending in a direction perpendicular to the directions in which the other two antenna elements extend;

first and second printed circuit boards each comprising a part within said enclosure, said printed circuit boards including means, within said enclosure, for processing electric current from the antenna elements resulting from an electric field to which said antenna elements are exposed, and producing an output representative of said field;

wherein each of said printed circuit boards has first and second opposite faces and a circuit board edge, a first conductive layer on the first face and extending along a border portion of the circuit board, a second conductive layer on the second face and extending along said border portion of the circuit board, and a third conductive layer on said circuit board edge and electrically connecting said first and second conductive layers;

wherein said field probe also comprises electrically conductive, compressible, gasket material;

wherein a first part of said border portion of said first printed circuit board is clamped between a first semi-circular shell edge of said second shell and a part of the circular shell edge of said first shell, and a second part of said border portion of said first printed circuit board is clamped between a first semi-circular shell edge of said third shell and another part of the circular shell edge of said first shell;

wherein a part of the border portion of said second printed circuit board is clamped between a second semi-circular shell edge of said second shell and a second semi-circular shell edge of said third shell;

whereon a part of said electrically conductive, compressible, gasket material extends along the length of each of said shell edges and is compressed between the last mentioned shell edge and an adjacent border portion of one of said printed circuit boards in opposed relationship to the last-mentioned shell edge;

wherein a first one of said antenna elements is supported by a portion of the first circuit board extending outward from said enclosure and through a first gap in the third conductive layer on the edge of said first circuit board wherein a second one of said antenna elements is supported by a portion of the first circuit board extending outward from said enclosure and through a second gap in the third conductive layer on the edge of said first circuit board; and wherein a third one of said antenna elements is supported by a portion of the second circuit board extending outward from said enclosure and through a gap in the third conductive layer on the edge of said second circuit board.

8. The field probe according to claim 7, in which said first one of said antenna elements is an electrically conductive trace supported by said portion of the first circuit board extending outward though said first gap, said second one of said antenna elements is an electrically conductive trace supported by said portion of the first circuit board extending outward though said second gap, and said third one of said antenna elements is an electrically conductive trace supported by said portion of the third circuit extending outward through said gap in the third conductive layer on the edge of said second circuit board.

9. The field probe according to claim 8, in which each of said circuit boards is a multi-layer circuit board, and in which each of said electrically conductive traces is located on an internal layer of the circuit board by which it is supported.

* * * * *